US008679864B2

(12) United States Patent
Xu

(10) Patent No.: US 8,679,864 B2
(45) Date of Patent: Mar. 25, 2014

(54) METHOD AND SYSTEM FOR DETERMINING SEMICONDUCTOR CHARACTERISTICS

(75) Inventor: Li Xu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 674 days.

(21) Appl. No.: 12/637,688

(22) Filed: Dec. 14, 2009

(65) Prior Publication Data

US 2010/0167428 A1 Jul. 1, 2010

Related U.S. Application Data

(62) Division of application No. 11/508,591, filed on Aug. 22, 2006, now Pat. No. 7,655,558.

(30) Foreign Application Priority Data

Jul. 21, 2006 (CN) .......................... 2006 1 0029292

(51) Int. Cl.
*H01L 21/66* (2006.01)
(52) U.S. Cl.
USPC ....................................... 438/14; 257/E21.53
(58) Field of Classification Search
USPC ....................................... 438/14; 257/E21.53
See application file for complete search history.

(56) References Cited

U.S. PATENT DOCUMENTS 4,994,409 A * 2/1991 Yoon et al. ................... 438/9
6,326,301 B1 * 12/2001 Venkatesan et al. .......... 438/638
6,514,860 B1 2/2003 Okada et al.
6,605,413 B1 * 8/2003 Lyons et al. ................. 430/314
7,655,558 B2 2/2010 Xu
2005/0085068 A1 4/2005 Chiang et al.

OTHER PUBLICATIONS

Notice of Allowance for U.S. Appl. No. 11/508,591, mailed on Sep. 14, 2009, 10 pages.
Non-Final Office Action for U.S. Appl. No. 11/508,591, mailed on Apr. 23, 2009, 11 pages.
Requirement for Restriction/Election for U.S. Appl. No. 11/508,591 mailed on Feb. 20, 2009, 6 pages.

* cited by examiner

*Primary Examiner* — Zandra Smith
*Assistant Examiner* — Toniae Thomas
(74) *Attorney, Agent, or Firm* — Kilpatrick Townsend & Stockton LLP

(57) ABSTRACT

A method for determining one or more characteristics of a partially processed integrated circuit includes a step for providing a substrate material. The method further includes a step for forming at least one opening within the substrate material. The opening can be characterized by an opening characteristic that includes a depth and a width associated with an unknown volume. The method includes a step for providing a fill material and processing the fill material to cause a first portion of the fill material to enter the opening and occupy an entirety of the unknown volume associated with the opening characteristic while a second portion of the fill material remains outside of the unknown volume. Moreover, the method includes a step for processing the second portion of the fill material using one or more processes to determine a spatial characteristic associated with the unknown volume.

44 Claims, 14 Drawing Sheets

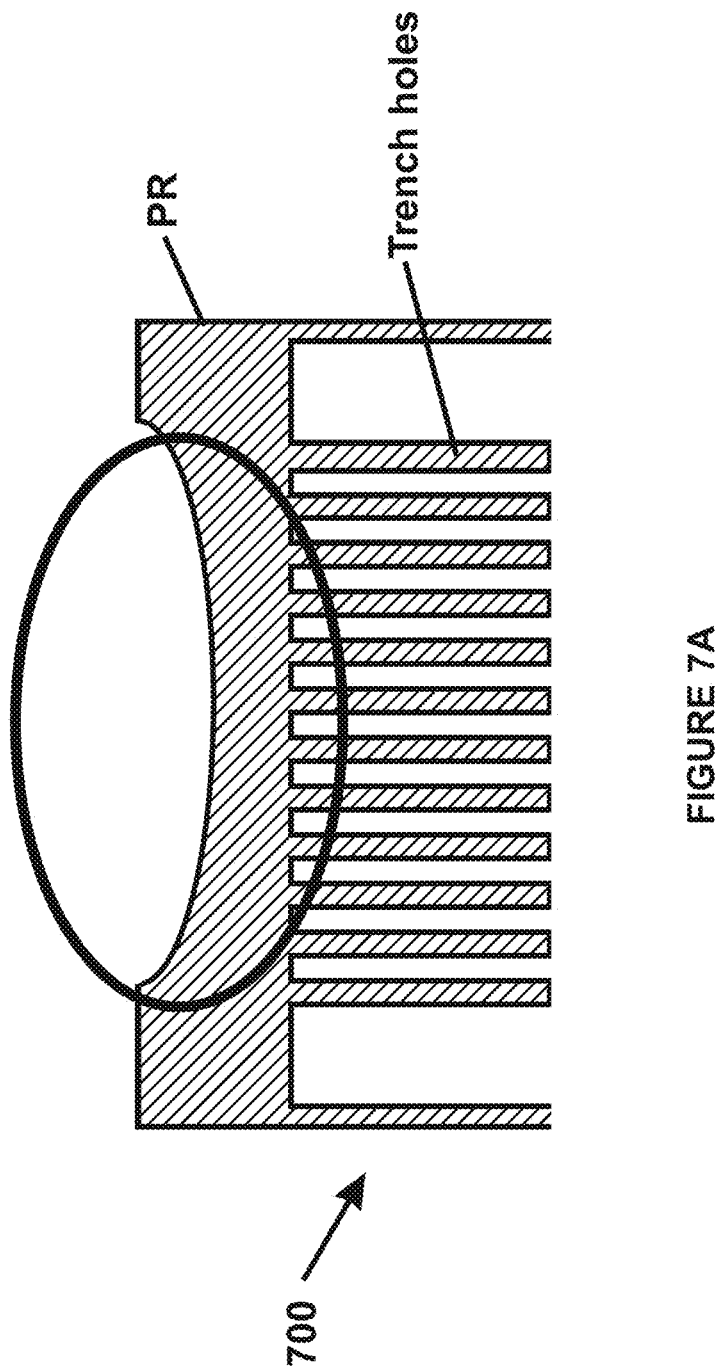

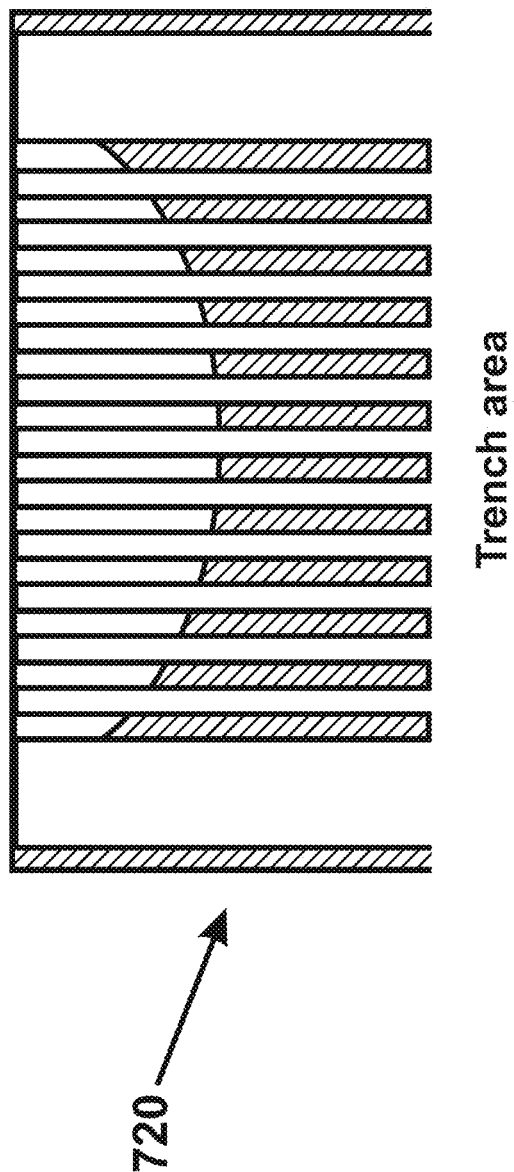

METHOD AND SYSTEM FOR DETERMINING SEMICONDUCTOR CHARACTERISTICS

CROSS-REFERENCES TO RELATED APPLICATIONS

This application claims priority to Chinese Patent Application No. 200610029292.7 filed on Jul. 21, 2006, commonly assigned and hereby incorporated by reference for all purposes.

BACKGROUND OF THE INVENTION

The present invention is directed to integrated circuits and their processing for the manufacture of semiconductor devices. In particular, the invention provides a method and device for monitoring various steps during the manufacturing of integrated circuits. Merely by way of example, the invention has been applied to measuring characteristics, such as dimensions, associated with trenching, etching, and/or growth process of a partially processed semiconductor for the manufacture of integrated circuits. More particularly, the invention provides a method for manufacturing integrated circuits using a monitoring technique for determining spatial dimensions of features, including trenches, and other features and the like. But it would be recognized that the invention has a much broader range of applicability. For example, an embodiment of the present invention provides a method for measuring capacitance of a partially processed integrated circuit.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is the conventional method used to measure various characteristics of partially process integrated circuits.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor Manufacturing International Corporation (SMIC) of Shanghai, China is an example of a chip company that performs foundry services. Although techniques for characterizing and evaluating partially or fully processed wafers are available, these techniques have many limitations.

As an example, it is often desirable to measure various characteristics (such as trench dimensions, electrical properties, etc.) of partially processed ICs during the manufacturing process. For example, dimensions of deep trenches (e.g., deep trenches for manufacturing of capacitors) are often a critical aspect of an IC. Various conventional techniques evaluate IC characteristics by dissecting partially processed ICs and examining the dissected ICs. Unfortunately, conventional techniques are often inadequate. That is, conventional techniques are often cumbersome, require manual cutting processes, are not efficient, and have high costs and other undesirable characteristics.

Therefore, an improved technique for processing semiconductor devices is desired.

BRIEF SUMMARY OF THE INVENTION

The present invention is directed to integrated circuits and their processing for the manufacture of semiconductor devices. In particular, the invention provides a method and device for monitoring process parameters during the manufacturing of integrated circuits. Merely by way of example, the invention has been applied to measuring characteristics, such as dimensions, associated with trenching, etching, and/or growth process of a partially processed semiconductor for the manufacture of integrated circuits. More particularly, the invention provides a method for manufacturing integrated circuits using a monitoring technique for determining spatial dimensions of features, including trenches, other features and the like. But it would be recognized that the invention has a much broader range of applicability. For example, an embodiment of the present invention provides a method for measuring a capacitance of a partially processed integrated circuit.

In a specific embodiment, the present invention provides a method for determining one or more characteristics of a partially processed integrated circuit. The method includes a step for providing a substrate material. For example, the substrate material can characterized by a substrate thickness and a substrate diameter. The method further includes a step for forming at least one opening (e.g., deep trench, etc) within the substrate material. The opening can be characterized by at least an opening characteristic. The opening characteristic includes a depth within a portion of the substrate thickness and an opening width. The depth and width are associated with an unknown volume. The method additionally includes a step for providing a predetermined amount of fill material. For example, a known amount of polymer material is provided. Additionally, the method includes a step for processing the fill material to cause a first portion of the fill material to enter the opening (e.g., by melting the polymer material and causing it to flow into the opening) and occupy an entirety of the unknown volume associated with the opening characteristic while a second portion of the fill material remains outside of the unknown volume associated with the opening characteristic. Moreover, the method includes a step for processing the second portion of the fill material using one or more processes to determine a spatial characteristic associated with the unknown volume.

In another specific embodiment, the invention provides a method for determining one or more characteristics of a partially processed integrated circuit. The method includes a step for providing a substrate material. For example, the substrate material is characterized by a first plurality of dimensions (e.g., size, thickness, etc.). The method also includes a step for forming one or more openings on the substrate material. For example, the one or more opening is characterized by at least an opening characteristic (e.g., depth, aspect ratio, size, etc).

The method additionally includes a step for providing a filling material. The filling material is consisted of a first portion and a second portion. The first portion is positioned within the one or more opening. The second portion is overlaying the one or more openings. The method also includes a step for determining at least a filling characteristic (e.g., amount of filling material being filled into the openings, ashing time for removing a predetermined amount filling material, etc.) of the filling material. Additionally, the method includes a step for determining the opening characteristic. The opening characteristic is associated with the filling characteristic.

According to another specific embodiment, the present invention provides a method for determining one or more characteristics of a partially processed integrated circuit. The method includes a step for providing a substrate material. For example, the substrate material is characterized by a first plurality of dimensions. The method additionally includes a step for forming one or more openings on the substrate material. For example, the one or more opening is characterized by at least an opening characteristic. Additionally, the method includes a step for providing a polymer material (e.g., photoresist material, etc.). The polymer material is overlaying the one or more openings. For example, the polymer material is characterized by a predetermined amount (e.g., volume, size, etc.). The method also includes a step for subjecting the polymer material to a predetermined condition (e.g., a hard bake process, high temperature, etc.). The polymer material becomes a fluid polymer material after being subjected to the predetermined condition. The fluid polymer material is consisted of a first portion and a second portion. The first portion is positioned within the one or more openings. The second portion is overlaying the one or more openings. The method additionally includes a step for determining one or more filling characteristics of the fluid polymer material. The method further includes a step for determining the opening characteristic. The opening characteristic is associated with the one or more filling characteristics.

According to yet another specific embodiment, the present invention provides a method for manufacturing integrated circuits. The method includes a step for providing a batch of semiconductor substrates for manufacturing integrated circuits. The method also includes a step for forming one or more openings on each of the substrates. For example, each of the openings is characterized by a depth and an aspect ratio. The method additionally includes a step for providing a filling material for each of the substrates. The filling material is consisting of a filling portion and a covering portion. The filling portion is positioned within the one or more openings on each of the substrate. The covering portion is overlaying the one or more openings on each of the substrate. The method additionally includes determining a filling characteristic for each of the substrates. The filling characteristic is associated with a size of the filling portion. The method also includes a step for determining an opening characteristic for each of the substrates based on the filling characteristics. The opening characteristic is associated with the depth and aspect ratio. The method additionally includes a step for processing each of the substrates. Moreover, the method includes a step for providing fully processed integrated circuits using each of the substrates. As defined herein, the term "substrate" or "substrates" can be interpreted by a meaning consistent with one of ordinary skill in the art. That is, the term substrate can include bulk substrates, multi-layered substrates (e.g., silicon wafer with overlying dielectric and metal films), graded substrates, silicon on insulator substrates, epitaxial silicon substrates, any combination of these, including layered substrates, partially processed wafers (including portions of integrated circuits and other elements), patterned and unpatterned wafers, and the like. Of course, there can be other variations, modifications, and alternatives.

Many benefits are achieved by way of the present invention over conventional techniques. For example, the present technique provides an easy to use process that relies upon conventional technology. In some embodiments, the method provides a method for measuring various characteristics of a partially processed IC without destroying the IC during the process. For example, various dimensional and electrically properties of deep trenches can be measured for every wafer during the manufacturing process. According to various embodiments, the present invention reduces manufacturing costs, enhances reliability, and improves consistency of ICs. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 7A-7C are simplified diagrams illustrating profiles of filling materials according to an embodiment of the present invention.

DETAILED DESCRIPTION OF THE INVENTION

The present invention is directed to integrated circuits and their processing for the manufacture of semiconductor devices. In particular, the invention provides a method and device for monitoring various steps during the manufacturing of integrated circuits. Merely by way of example, the invention has been applied to measuring characteristics, such as dimensions, associated with trenching, etching, and/or growth process of a partially processed semiconductor for the manufacture of integrated circuits. More particularly, the invention provides a method for manufacturing integrated circuits using a monitoring technique for determining spatial dimensions of features, including trenches, and other features and the like. But it would be recognized that the invention has a much broader range of applicability. For example, an embodiment of the present invention provides a method for method for measuring capacitance of a partially processed integrated circuit.

As discussed above, various conventional techniques have been used to monitor the manufacturing process and to measure various characteristics (e.g., size, dimension, capacitance, etc.). Typically, conventional techniques destroy wafers that are monitored and/or measured. For example, a conventional technique requires that a semiconductor wafer to be dissected before various measurements and examination can be conducted.

Figure 1:
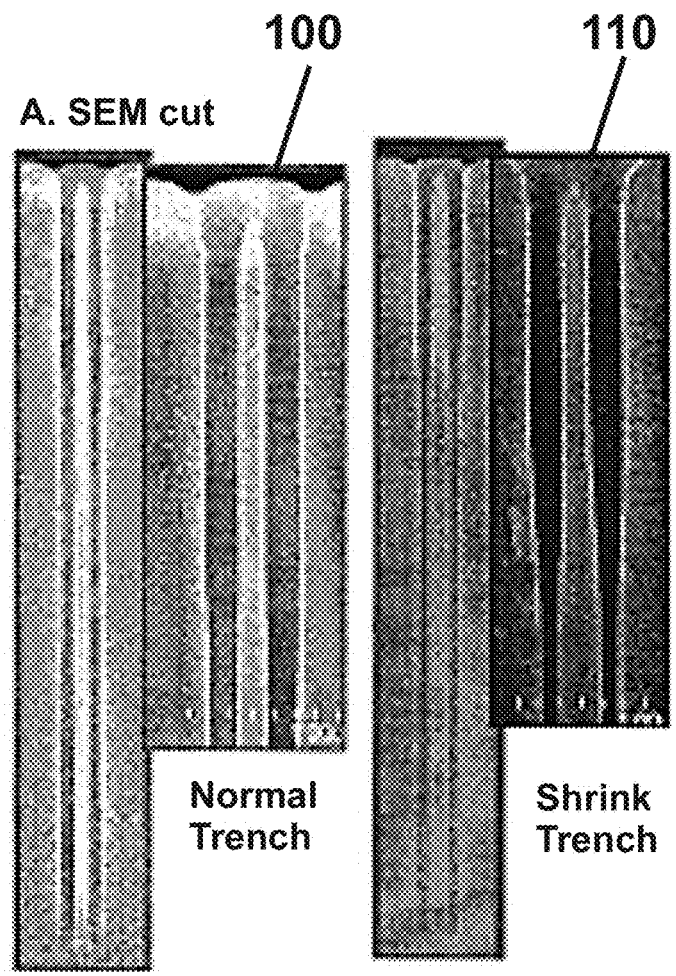
FIG. 1 is a simplified diagram illustrating vertical dissections of semiconductor wafers.

FIG. 1 is a diagram illustrating vertical dissections of semiconductor wafers. As shown, a vertical dissection 100 illustrates the vertical dissection of normal (i.e., or desirable) trenches on a wafer. A vertical dissection 110 illustrates the vertical dissection of shrank (i.e., undesirable or even defective) trenches. Compared with trenches shown in vertical dissection 100, trenches shown in the vertical dissection 110 have smaller sizes and the widths of trenches drastically decrease toward the deep end of trenches.

Figure 2:
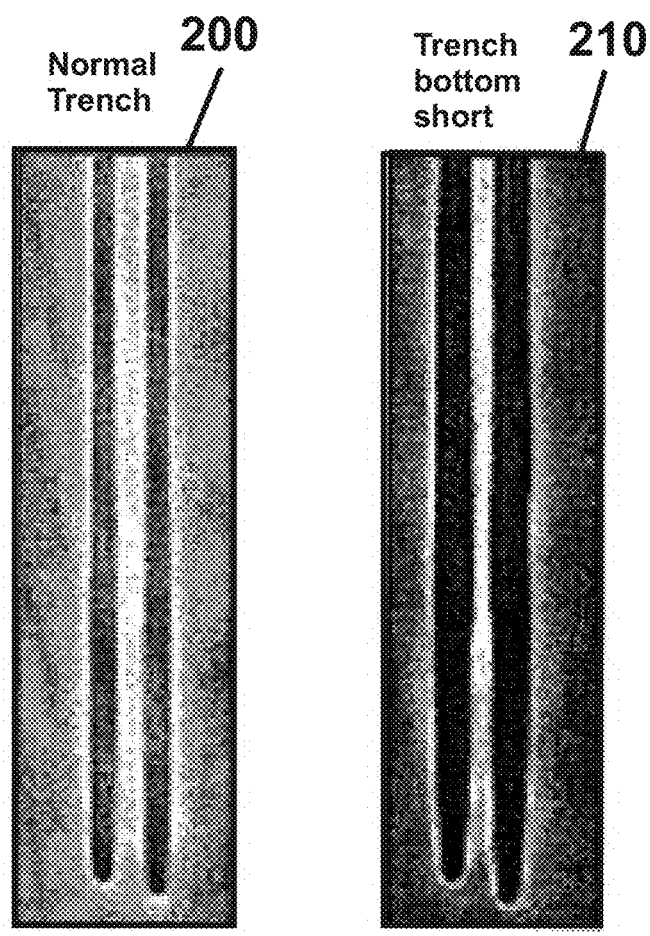
FIG. 2 is a simplified diagram illustrating vertical sections of semiconductor wafers.

FIG. 2 is a diagram illustrating vertical sections of semiconductor wafers. As shown, a vertical dissection 200 illustrates the cross section of normal (i.e., or desirable) trenches on a wafer. A vertical dissection 210 illustrates the cross section of bottom-short (i.e., undesirable or even defective) trenches. Compared with trenches shown in the vertical dissection 200, trenches shown in the vertical dissection 210 are shallower.

Figure 3:
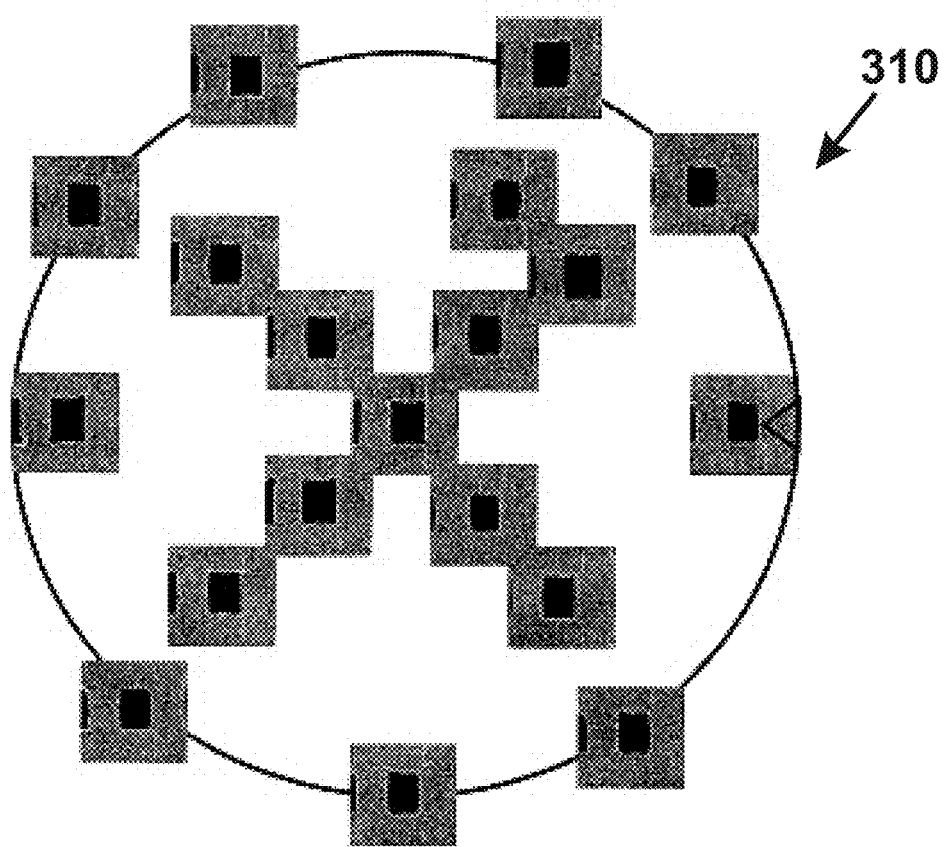
FIG. 3 is a simplified diagram illustrating a cross section of a partially process wafer.
Figure 3A:
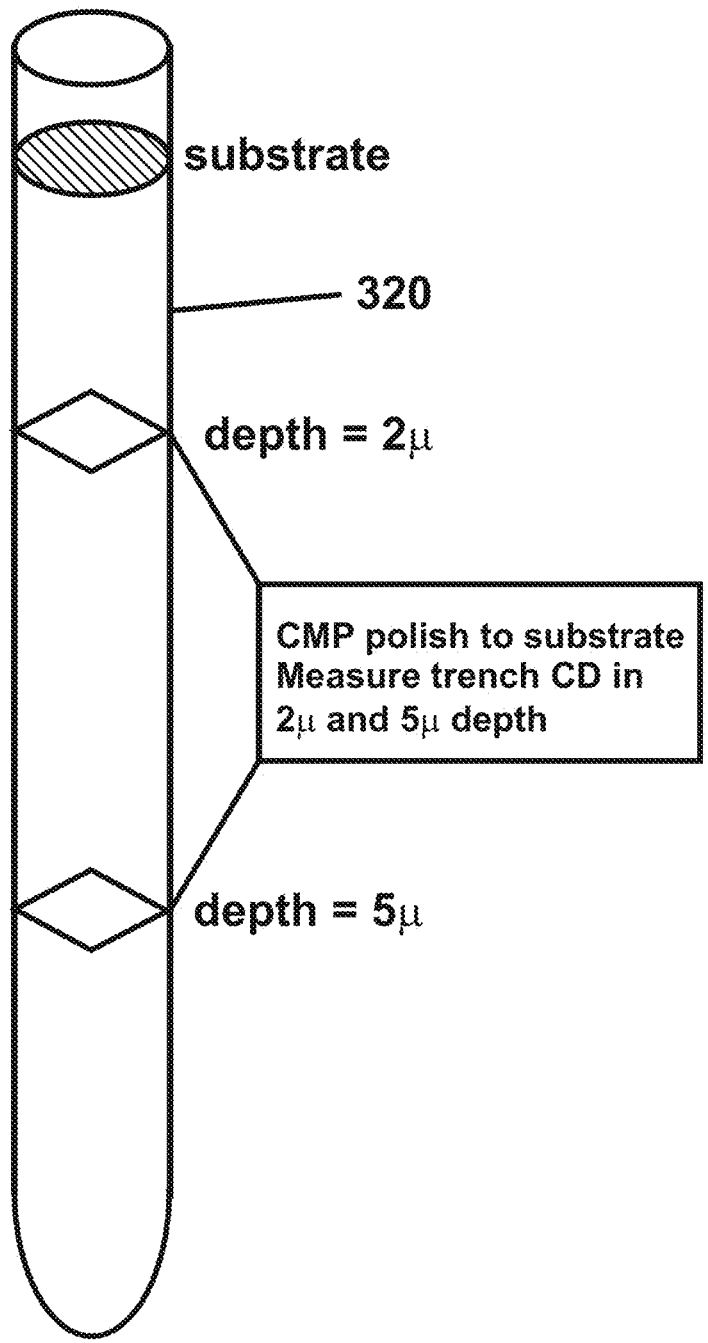
FIG. 3A is a simplified diagram illustrating a process for obtaining cross sections of a partially processed wafer material.

In addition to examining vertical dissections, cross sections can be used to measure various characteristics of wafers. FIG. 3 is a diagram illustrating a cross section of a partially process wafer. For example, a cross section 310 is obtained through chemical mechanical polishing (CMP) process. FIG. 3A is a diagram illustrating a process for obtaining cross sections of a partially processed wafer material. For example, cross sections at depth of two micrometers and five micrometers are obtained through CMP processes. Based on the sizes of opening at two depths, various characteristic (e.g., depth, capacity, capacitance, etc.) can be measured.

By obtaining vertical dissection and/or cross sections of wafers and examining the dissected wafers, conventional techniques provide tools for monitoring the manufacturing process. Unfortunately, the abovementioned conventional techniques are costly and inefficient. For example, conventional techniques destroy the subject wafer during the process. As a result, only selected—not all of—wafers are examined. In addition, the process of dissecting and examining wafers according to the conventional technique often take hours.

Therefore, it is to be appreciated according to various embodiments, the present invention allows various characteristics of partially processed semiconductor wafers to be measured without damaging the wafers.

Figure 4:
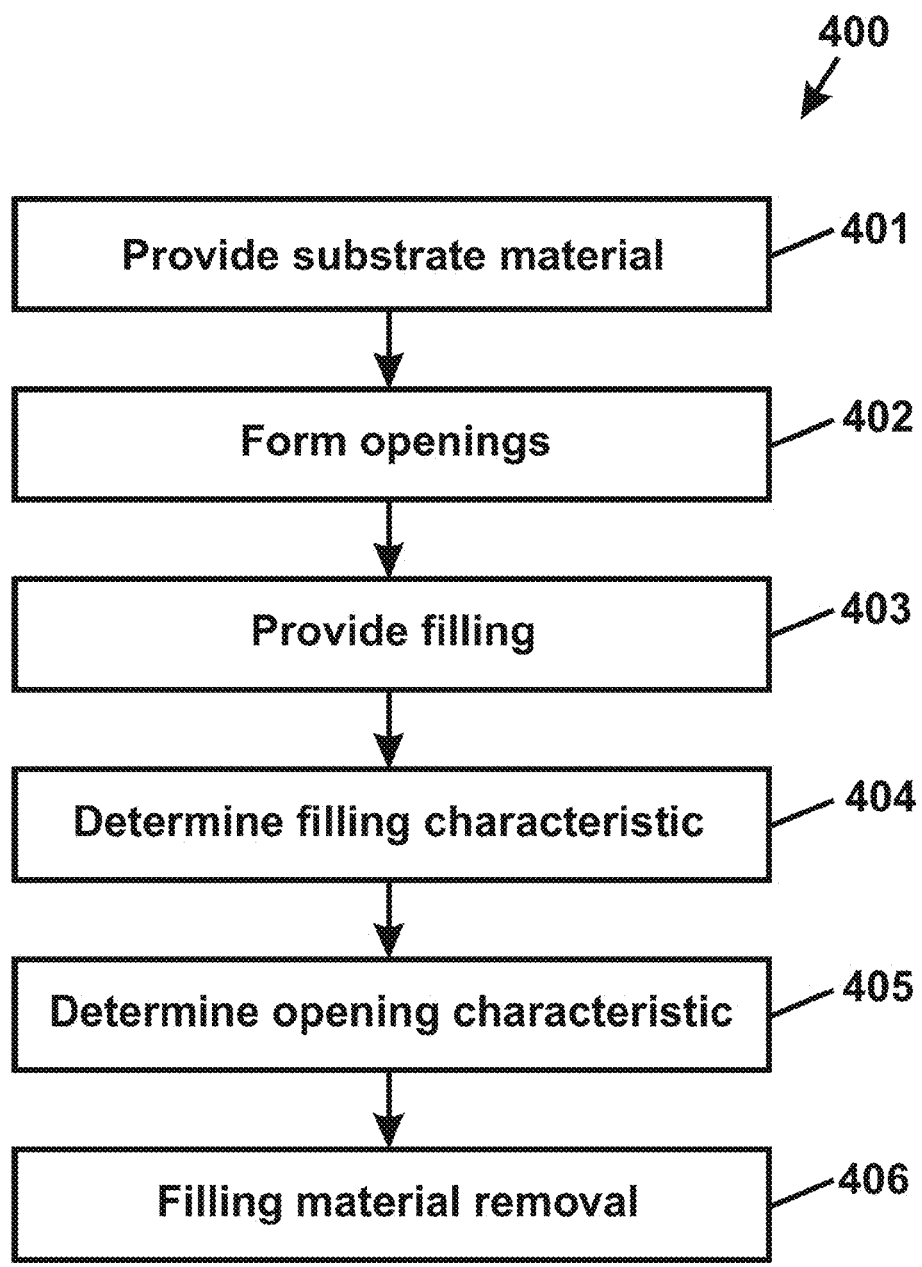
FIG. 4 is a simplified flow diagram illustrating a method for determining various characteristics of semiconductor wafers according to an embodiment of the present invention.

FIG. 4 is a simplified flow diagram illustrating a method for determining various characteristics of semiconductor wafers according to an embodiment of the present invention. This diagram is merely an example, which should not unduly limit the scope of the claims. One of ordinary skill in the art would recognize many variations, alternatives, and modifications. For example, various steps may be added, removed, moved, replaced, repeated, overlapped, and/or partially overlapped.

At step 401, a substrate material is provided. For example, the substrate material includes pure silicon material that is used for the manufacturing of semiconductor wafer. The semiconductor can be characterized by various dimensions. According to a specific embodiment, the substrate material is in a circular shape characterized by a diameter of twelve inches. The substrate material can have other dimensions as well.

At step 402, one or more openings are formed on the substrate material. Depending upon application, various techniques can be used to form openings on the substrate material. According to a specific embodiment, etching process is performed to for opening. For example, plasma etching is performed to form deep trenches on the substrate material. According to another specific embodiment, openings are formed on the substrate material by way of silicon growth.

Figure 5:
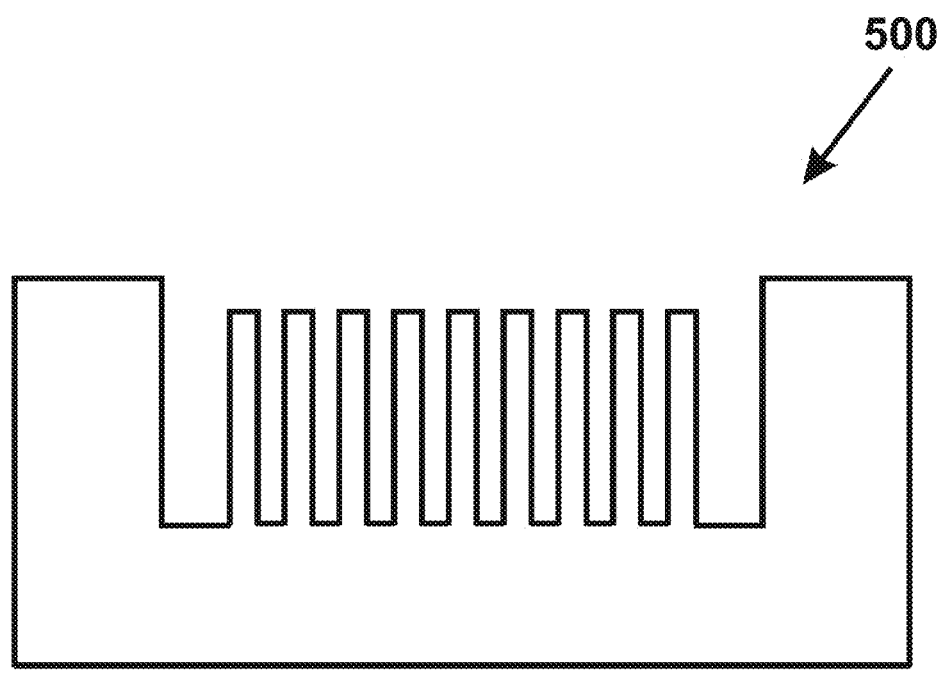
FIG. 5 is a simplified diagram illustrating openings formed on a substrate material according an embodiment of the present invention.

FIG. 5 is a simplified diagram illustrating openings formed on a substrate material according an embodiment of the present invention. This diagram is merely an example, which should not unduly limit the scope of the claims. One of ordinary skill in the art would recognize many variations, alternatives, and modifications. As seen in FIG. 5, a partially processed semiconductor wafer 500 includes a number of openings. The openings have various physical and electrical characteristics, such as depth, size, capacity, spacing distance, aspect ration, etc. For example, the openings are deep trenches with an aspect ratio (i.e., depth v. width) of more than 10:1. As another example, the openings are used to form capacitors, whose electrical characteristics are related to physical dimensions of the openings.

Now referring back to FIG. 4. At step 403, filling materials are provided and filled into the openings on the substrate. Depending upon applications, various types of filing materials can be used. For example, fluid material and fluid-like materials (e.g., solid polymer material that exhibit fluid characteristics after being exposed to high temperature) are used as filling material. According to a specific embodiment, liquid material (such as water) is used as a filling material. According to another specific embodiment, photoresist material is used as a filling material. Other materials with fluid-like flowing characteristics can be used as well.

Figure 6:
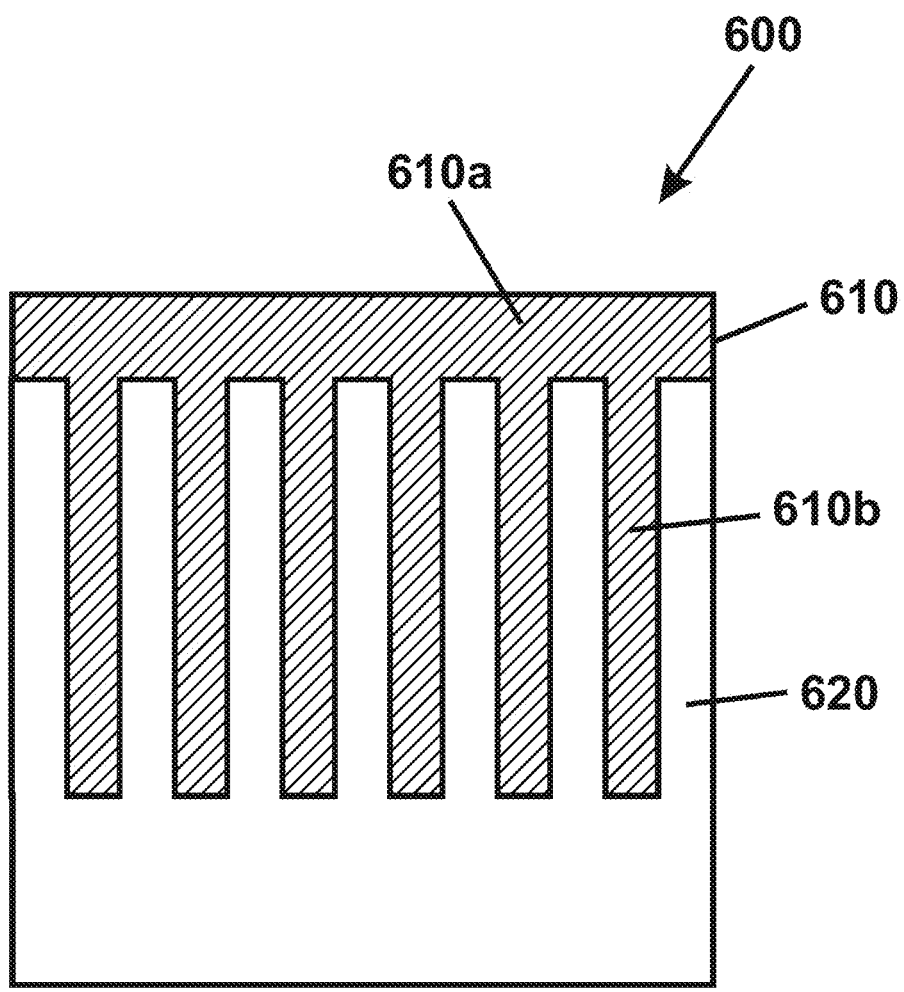
FIG. 6 is a simplified diagram illustrating filling of openings according to an embodiment of the present invention.

FIG. 6 is a simplified diagram illustrating filling of openings according to an embodiment of the present invention. This diagram is merely an example, which should not unduly limit the scope of the claims. One of ordinary skill in the art would recognize many variations, alternatives, and modifications. As shown in FIG. 6, after the filling process, a partially processed wafer includes a partially process semiconductor wafer 620 and a filling material 610. The filling material 610 can be defined as two portions: a first portion 610b that is filled into the openings and a second portion 610a that overlays the openings. According to another embodiment, the filling material 610 does not includes a second portion that overlays the openings. There can be other variations as well.

Now referring back to FIG. 4. At step 404, various characteristics of the filling material are determined. According to a specific embodiment, the amount of filling material that are filled into the openings is determined. For example, a predetermined amount of filling material is filled into the openings, and thickness of filling material overlaying the openings (i.e., the portion of filling material that does not fill into the openings) is used to determine the amount of filling material that is filled into the openings. For example, if two milliliters of filling material is filled into the openings and one milliliter of filling material is overlaying the openings, it can be determined that one milliliter of filling material is filled into the openings.

Figure 7B:
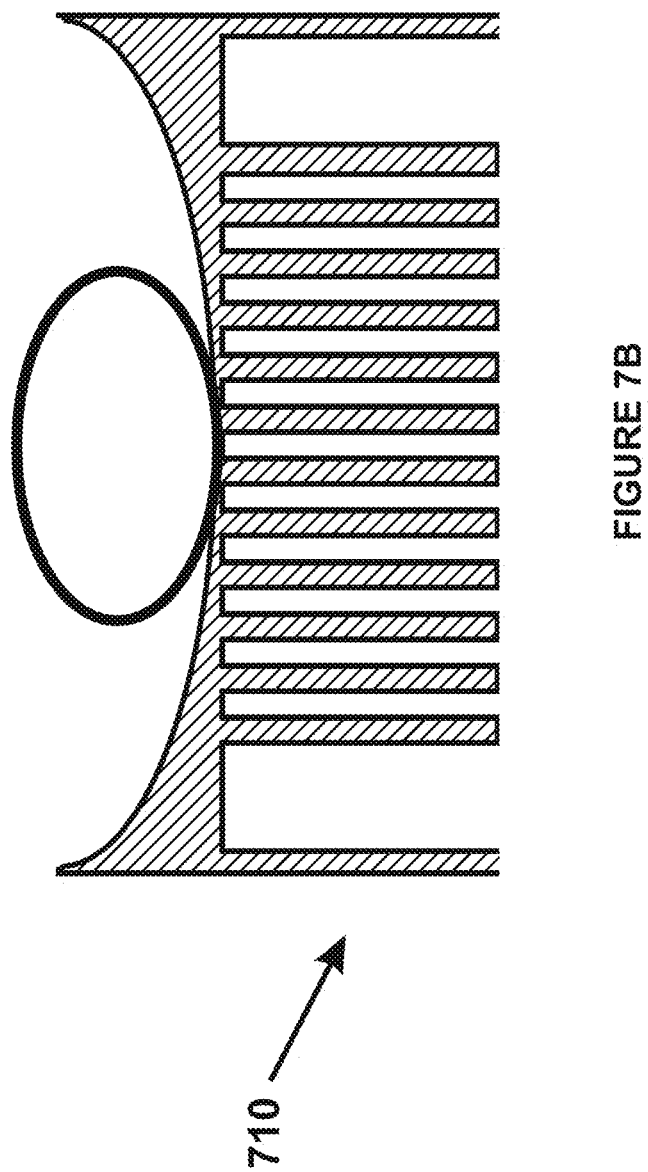

According to another specific embodiment, filling characteristics include a profile of the filling material. FIGS. 7A-7C are simplified diagrams illustrating profiles of filling materials according to an embodiment of the present invention. These diagrams merely provide an example, which should not unduly limit the scope of the claims. One of ordinary skill in the art would recognize many variations, alternatives, and modifications. For essentially the same amount of filling material (e.g., photoresist material) used, a profile 700 in FIG. 7A illustrates a situation where the openings are small and most of the filling material remains on the top, a profile 720 in FIG. 7C illustrates a situation where the openings are large and almost all of the filling material is filled into the openings; and a profile 710 in FIG. 7B illustrates a situation where the size of openings is between the sizes of openings illustrated in FIG. 7A and FIG. 7C.

According to yet another specific embodiment, filling characteristics includes etching and/or recess time of the filling material. For example, longer recess time of filling material overlaying the openings means the openings are small and most of the filling materials are not filled into the openings, and vice versa. There can be other filling characteristics as well.

Now referring back to FIG. 4. At step 405, various characteristics of the openings are determined. According to an embodiment, the size of the openings is determined based on the amount of filling material filled into the openings. According to another embodiment, the size of the openings is determined based on the amount of filling material overlaying the openings. Depending upon application, the sizes and shape of the openings can be determined based on a profile (e.g., shape) of filling material overlaying the openings. According yet another specific embodiment, various characteristics of the openings are determined by comparing filling characteristic of a target wafer with reference data. For example, reference data includes previous determined values (e.g., measurement performed using conventional techniques such as dissection data).

Figure 8:
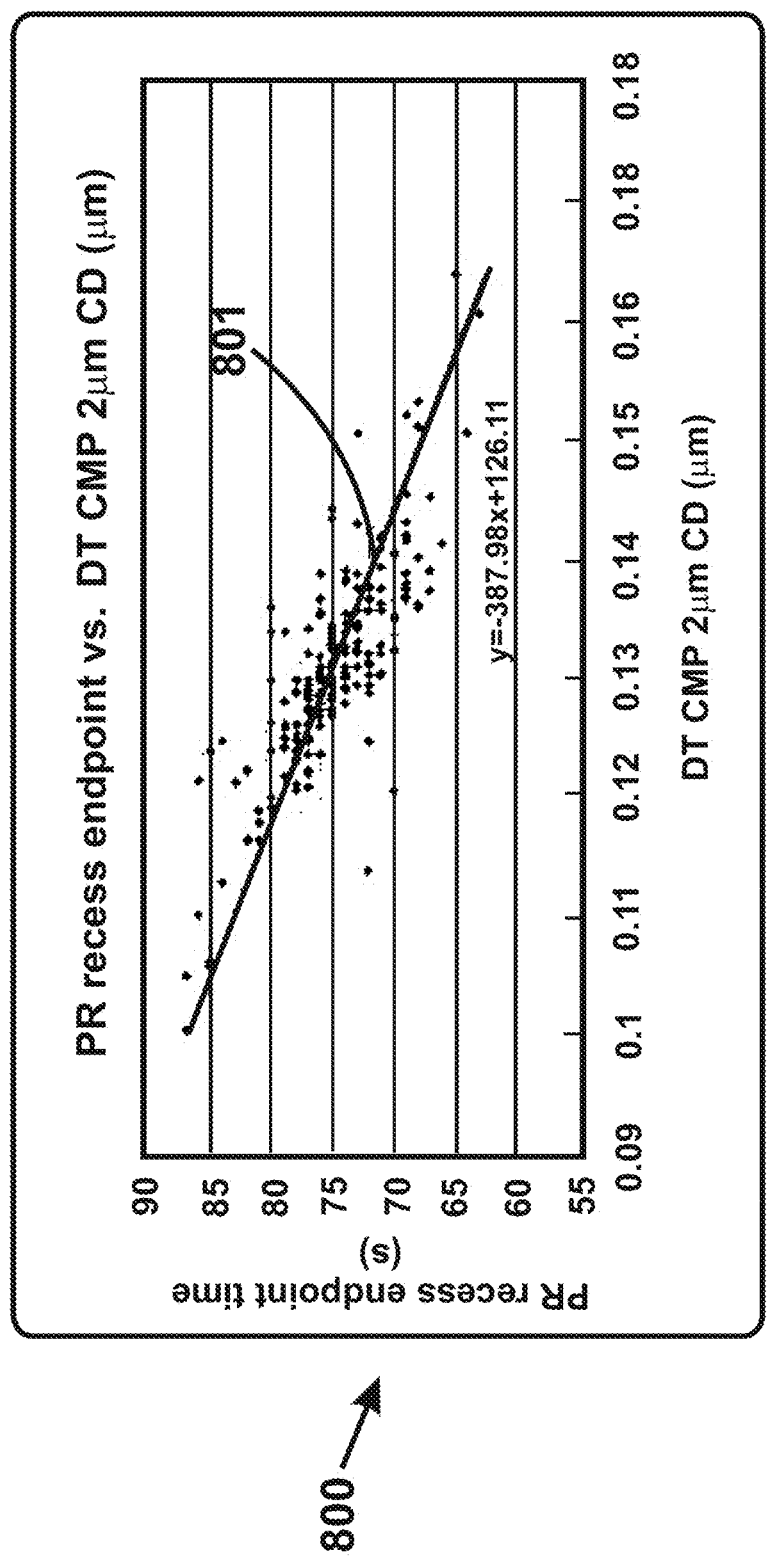
FIG. 8 is a simplified diagram of reference data according to an embodiment of the present invention.

FIG. 8 is a simplified diagram of reference data according to an embodiment of the present invention. This diagram is merely an example, which should not unduly limit the scope of the claims. One of ordinary skill in the art would recognize many variations, alternatives, and modifications. A filling characteristic (e.g., the photoresist recess time) is plotted against sizes of openings at 2 micrometer depth in a graph 800. During the process of determining various dimensions of the openings, the graph 800 can be used. For example, a recess time of 70 seconds corresponds to an approximately 0.145 micrometer opening size at 2 micrometer depth according to graph 800. It is to be understood other types of reference data can be used to determine various characteristics of the openings.

Figure 9:
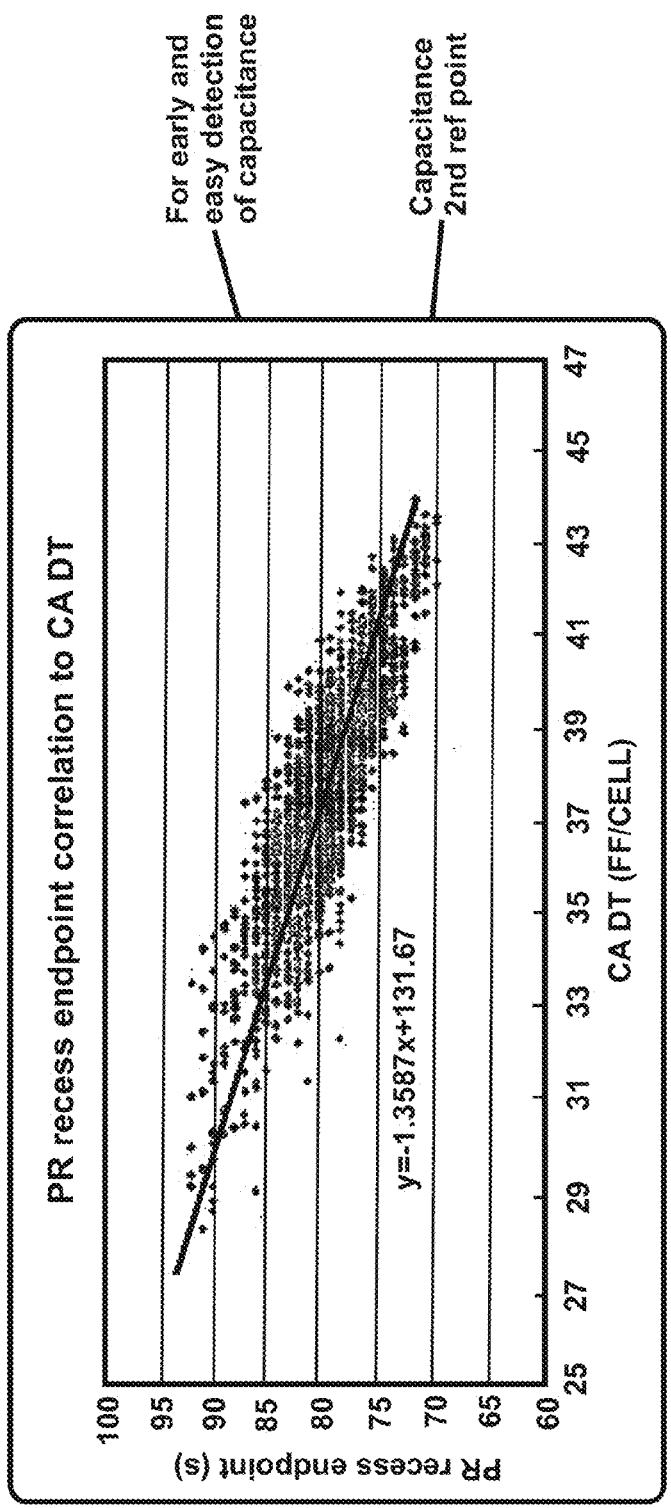
FIG. 9 is another simplified diagram of reference data according to an embodiment of the present invention.

FIG. 9 is another simplified diagram of reference data according to an embodiment of the present invention. This diagram is merely an example, which should not unduly limit the scope of the claims. One of ordinary skill in the art would recognize many variations, alternatives, and modifications. A filling characteristic (e.g., the photoresist recess time) is plotted against the capacitances of the openings in graph 900. It is to be that the present invention provides, among other things, a method for measuring various characteristics such as capacitance at an early stage of the manufacturing process. Typically, capacitance of certain integrated circuits is determined at a later stage of the manufacturing process.

Figure 10:
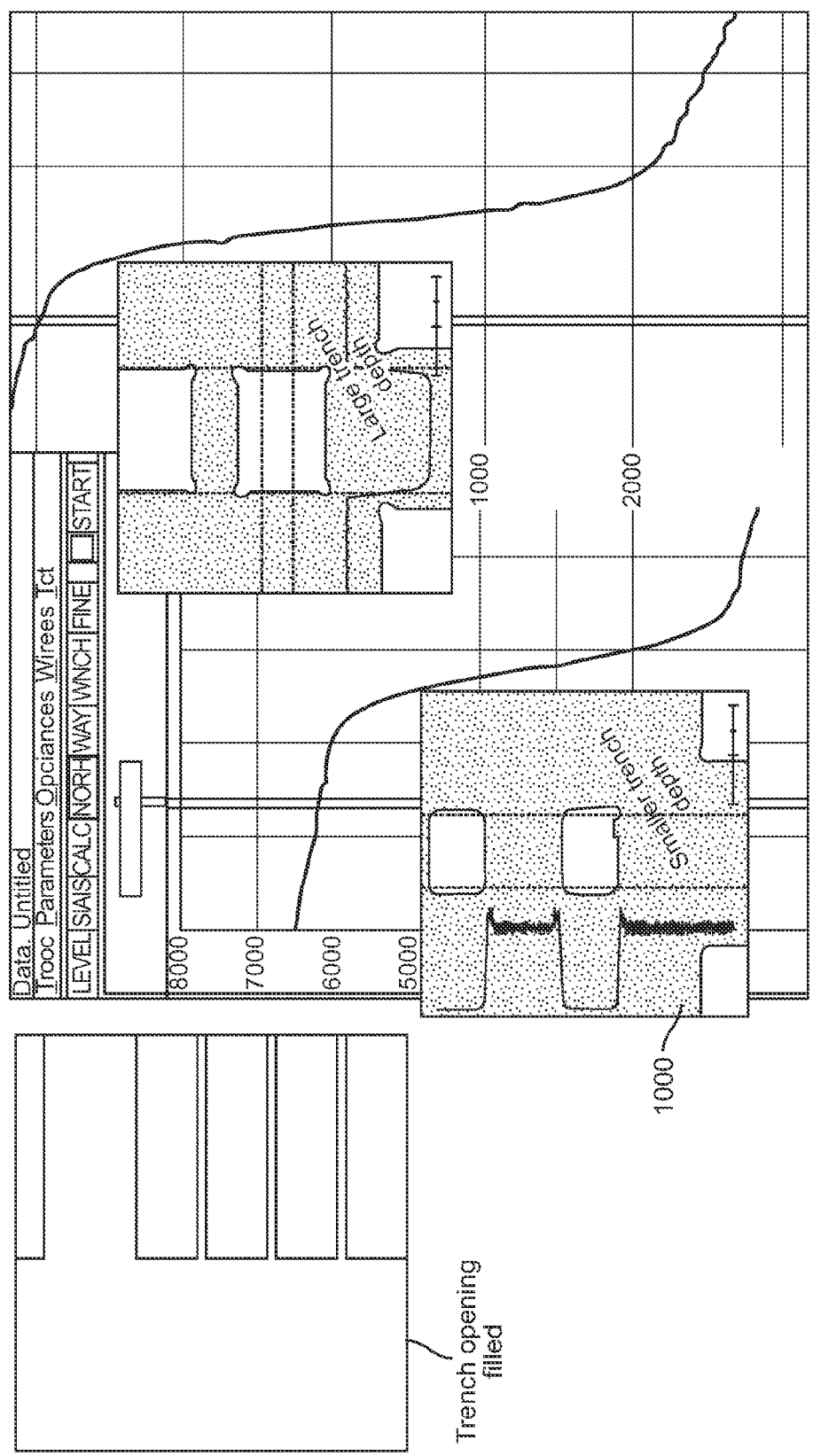
FIG. 10 is a simplified diagram illustrating a utility used according to an embodiment of the present invention.

It is to be appreciated that the present invention allows detailed characteristics of the openings to be obtained. FIG. 10 is a simplified diagram illustrating a utility used according to an embodiment of the present invention. This diagram is merely an example, which should not unduly limit the scope of the claims. One of ordinary skill in the art would recognize many variations, alternatives, and modifications. A screen shot 1000 illustrates a computerized tool used to determine various characteristics of the openings based on a profile of the filling material.

Now referring back to FIG. 4. At step 406, the filling material is removed. According to an embodiment, the filling material is a photoresist material and is partially removed at the step 406. Depending upon application, the removal material is removed, remained, or partially removed. One of the ordinary skills in the art would understand that the removal of filling material is compatible with existing techniques.

Figure 11:
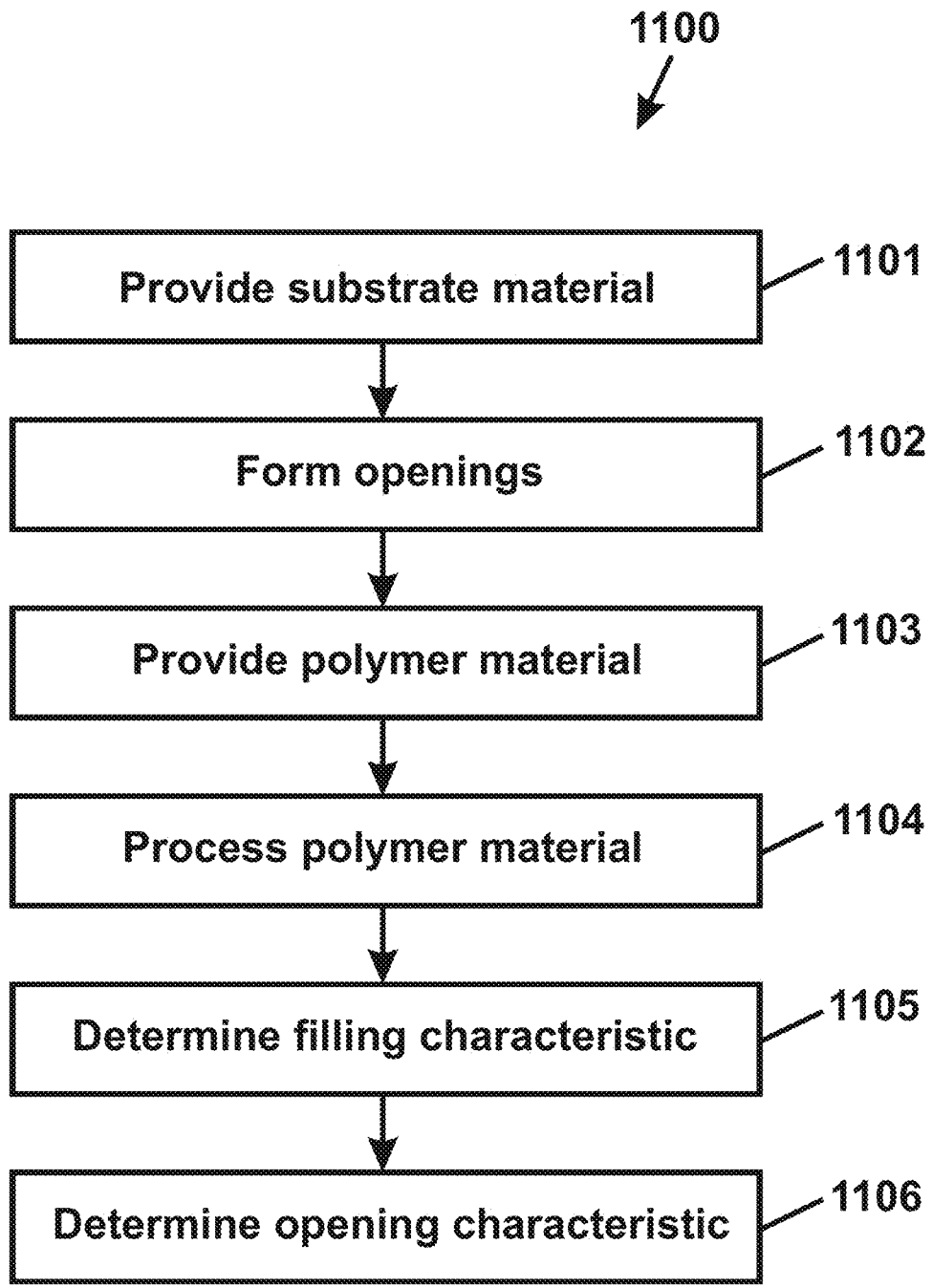
FIG. 11 is a simplified flow diagram illustrating an embodiment of the present invention.

FIG. 11 is a simply flow diagram illustrating an embodiment of the present invention. This diagram is merely an example, which should not unduly limit the scope of the claims. One of ordinary skill in the art would recognize many variations, alternatives, and modifications. For example, various steps may be added, removed, moved, replaced, repeated, overlapped, and/or partially overlapped.

At step 1101, a substrate material is provided. For example, the substrate material includes pure silicon material that is used for the manufacturing of semiconductor wafer. The semiconductor can be characterized by various dimensions. According to a specific embodiment, the substrate material is in a circular shape characterized by a diameter of twelve inches. The substrate material can have other dimensions as well.

At step 1102, one or more openings are formed on the substrate material. Depending upon application, various techniques can be used to form openings on the substrate material. According to a specific embodiment, etching process is performed to for opening. For example, plasma etching is performed to form deep trenches on the substrate material. According to another specific embodiment, openings are formed on the substrate material by way of silicon growth.

At step 1103, a predetermined amount of polymer material is provided. According to a specific embodiment, the polymer material is a solid material. For example, the polymer material is a photoresist material. Typically, a polymer material in solid form has a high viscosity value and therefore does not fill into the openings.

At step 1104, the polymer material is processed. According to a specific example, the polymer material is subject to a hard bake process and is melted into a fluid form. For example, after the hard bake process, the polymer material becomes a fluid polymer material.

Typically, the fluid polymer material has a lower viscosity value than the solid polymer material before melting. Due to low viscosity, the fluid polymer material fills into the openings. The fluid polymer material, after fillings into the openings, has a first portion that is fills into the openings and a second portion that is covering the openings. Depending upon application, the fluid polymer material is hardened after being filled into the openings.

At step 1105, various filling characteristics of the polymer material are determined. According to a specific embodiment, the amount of polymer material filled into the openings is determined. For example, since the total amount of polymer materials is known, the amount of polymer material filled into the openings is the total amount of polymer material less the amount polymer material covering (i.e., polymer materials that did not filled into the openings) the openings. According to another specific embodiment, the amount of time required to remove (or partially remove) the polymer material that overlays the openings is determined. For example, a long removal time indicates that there is a large amount of polymer material lying on top of the openings, and a small amount of polymer material is filled into the openings.

At step 1106, various characteristics of the openings are determined. According to an embodiment, the physical dimensions of the openings are determined based on the amount of polymers filled into the openings. According to another embodiment, physical dimensions of the openings are determined by comparing the newly determined filling characteristics with predetermined reference data. It is to be appreciated that various embodiments of the present invention allows other characteristics, such as capacitance, of the openings to be determined as well.

Typically, after various characteristics of the openings are determined, the polymer material is removed. For example, an ashing process is used to remove the polymer material. There can be other methods for removing the polymer material as well.

In a specific embodiment, the present invention provides a method for determining one or more characteristics of a partially processed integrated circuit. The method includes a step for providing a substrate material. For example, the substrate material can be characterized by a substrate thickness and a substrate diameter. The method further includes a step for forming at least one opening (e.g., deep trench, etc) within the substrate material. The opening can be characterized by at least an opening characteristic. The opening characteristic includes a depth within a portion of the substrate thickness and an opening width. The depth and width are associated with an unknown volume. The method additionally includes a step for providing a predetermined amount of fill material. For example, a known amount of polymer material is provided. Additionally, the method includes a step for processing the fill material to cause a first portion of the fill material to enter the opening (e.g., by melting the polymer material and causing it to flow into the opening) and occupy an entirety of the unknown volume associated with the opening characteristic while a second portion of the fill material remains outside of the unknown volume associated with the opening characteristic. Moreover, the method includes a step for processing the second portion of the fill material using one or more processes to determine a spatial characteristic associated with the unknown volume.

According to another embodiment, the present invention provides a method for manufacturing integrated circuits. The method includes a step for providing a batch of semiconductor substrates for manufacturing integrated circuits. The method also includes a step for forming one or more openings on each of the substrates. For example, the one or more openings are formed by etching processes. Each of the openings can be characterized by a depth and an aspect ratio. For example, the aspect for a deep trench is typically more than 10:1. The method also includes a step for providing a filling material for each of the substrates. The filling material is consisted of a filling portion and a covering portion. The filling portion is positioned within the one or more openings on each of the substrate, the covering portion overlaying the one or more openings on each of the substrate. The method additionally includes a step for determining a filling characteristic for each of the substrates. For example, the filling characteristic is associated with a size of the filling portion. The method additionally includes a step for determining an opening characteristic for each of the substrates based on the filling characteristics. For example the opening characteristic is associated with the depth and aspect ratio. Additionally, the method includes a step for processing each of the substrates. It is to be appreciated that the present invention provides a way to determine various characteristics (such as depth, aspect ratio, size, etc.) of the openings without damaging the substrates or structures thereof, each and every wafer that is being processed can be monitored and tested. Additionally, the method includes a step for providing fully processed integrated circuits based using each of the substrates.

Many benefits are achieved by way of the present invention over conventional techniques. For example, the present technique provides an easy to use process that relies upon conventional technology. In some embodiments, the method provides a method for measuring various characteristics of a partially processed IC without destroying the IC during the process. For example, various dimensional and electrically properties of deep trenches can be measured for every wafer during the manufacturing process. According to various embodiments, the present invention reduces manufacturing costs, enhances reliability, and improves consistency of ICs. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for determining one or more characteristics of a partially processed integrated circuit, the method comprising:
    providing a substrate material, the substrate material being characterized by a substrate thickness and a substrate diameter;
    forming at least one opening within the substrate material, the opening being characterized by at least an opening characteristic, the opening characteristic being a depth within a portion of the substrate thickness and an opening width, the depth and width being associated with an unknown volume;
    providing a predetermined amount of fill material;
    processing the fill material to cause a first portion of the fill material to enter the opening and occupy an entirety of the unknown volume associated with the opening characteristic while a second portion of the fill material remains outside of the unknown volume associated with the opening characteristic; and
    determining a spatial dimension associated with the unknown volume by processing the second portion of the fill material,
    wherein forming the opening comprises etching.

2. The method of claim 1 wherein the partially processed integrated circuit is used for producing capacitors.

3. The method of claim 1 wherein the at least one opening comprises a deep trench having a depth to width ratio greater than 10:1.

4. The method of claim 1 wherein the fill material comprises a photoresist material.

5. The method of claim 1 wherein the fill material comprises a fluid material.

6. The method of claim 1 wherein the fill material consisting of liquid material.

7. The method of claim 1 wherein the fill material comprises a polymer material.

8. The method of claim 1 wherein the processing the second portion of the fill material comprises:
   determining a filling characteristic associate with the second fill material;
   determining the spatial dimension associated with the unknown volume based on the filling characteristics.

9. The method of claim 8 wherein the filling characteristics comprise a volume displacement.

10. The method of claim 8 wherein the filling characteristics comprise a thickness of the second portion.

11. The method of claim 8 wherein the filling characteristics comprise a recess time of the filling material.

12. The method of claim 8 wherein the filling characteristics comprise an ashing time of the filling material.

13. The method of claim 1 further comprising removing of the fill material.

14. The method of claim 1 further comprising partially removing of the fill material.

15. The method of claim 1 wherein the opening characteristic comprises trench depths.

16. The method of claim 1 wherein the opening characteristic comprises an opening size.

17. The method of claim 1 wherein the opening characteristic comprises a capacitance.

18. The method of claim 1 wherein the opening characteristic comprises an aspect ratio.

19. The method of claim 8 wherein the determining the spatial dimension comprises:
   providing a set of reference data;
   comparing the filling characteristic with the set of reference data.

20. The method of claim 1 wherein the substrate comprises a plurality of films overlying a substrate material.

21. The method of claim 1 wherein the substrate comprises a silicon wafer including an overlying one or more films.

22. The method of claim 1 wherein the opening diameter and the opening depth include an aspect ratio (depth/diameter) of at least seven.

23. The method of claim 1 wherein the opening diameter is about 90 nanometers and less.

24. A method for determining one or more characteristics or a partially processed integrated circuit, the method comprising:
   providing a substrate material, the substrate material being characterized by a first plurality of dimensions;
   forming one or more openings on the substrate material, the one or more opening being characterized by at least an opening characteristic;
   providing a polymer material, the polymer material overlaying the one or more openings, the polymer material being characterized by a predetermined amount;
   subjecting the polymer material to a predetermined condition, wherein the polymer material becomes a fluid polymer material after being subjected to the predetermined condition, the fluid polymer material consisting of a first portion and a second portion, the first portion being positioned within one or more openings, the second portion overlaying the one or more openings;
   determining one or more filling characteristics of the fluid polymer material; and
   determining the opening characteristic, the opening characteristic being associated with the one or more filling characteristics.

25. The method of claim 24 wherein the opening characteristic comprises a trench depth.

26. The method of claim 24 wherein the opening characteristic is an aspect ratio.

27. The method of claim 24 wherein the predetermined condition comprises a predetermined temperature.

28. The method of claim 24 wherein the predetermined condition is associated with a hard bake process.

29. The method of claim 24 wherein each of the openings is characterized by an aspect ratio of at least 10:1.

30. The method of claim 24 wherein the filling one or more filling characteristic comprise a volume of the first portion.

31. The method of claim 24 wherein the filling one or more filling characteristic comprise a thickness of the second portion.

32. The method of claim 24 wherein the filling one or more filling characteristic comprise a profile of the second portion.

33. The method of claim 24 wherein the filling one or more filling characteristic comprise a time required to remove a predetermined amount of the second portion.

34. The method of claim 24 wherein determining one or more filling characteristics of the fluid polymer material comprises:
   removing a predetermined amount of the fluid polymer material;
   determining a time associated with removing the predetermined amount of the fluid polymer material.

35. The method of claim 34 wherein removing the second portion comprises an ashing process.

36. The method of claim 24 wherein the polymer material is characterized by a first viscosity value and the fluid polymer material is characterized by a second viscosity value, the first viscosity value being less than the second viscosity value.

37. The method of claim 24 wherein the determining the opening characteristic comprises:
   providing a plurality of reference data, the plurality of reference data being associated with a plurality of predetermined opening characteristics and a plurality of predetermined filling characteristics;
   determining the opening characteristic based on the plurality of reference data.

38. The method of claim 24 comprising removing a predetermined amount of fluid polymer material.

39. The method of claim 24 wherein the polymer material is a solid material.

40. The method of claim 24 wherein the fluid polymer material is characterized by a flowing characteristic.

41. The method of claim 24 wherein the fluid polymer material is the polymer material in liquid form after the polymer material is melted under high temperature.

42. A method for manufacturing integrated circuits comprising:
   providing a batch of semiconductor substrates for manufacturing integrated circuits;
   forming one or more openings on each of the substrates, each of the openings being characterized by a depth and an aspect ratio;
   providing a filling material for each of the substrates, the filling material consisting of a filling portion and a covering portion, the filling portion positioned within the one or more openings on each side of the substrate, the covering portion overlaying the one or more openings on each of the substrate;
   determining a filling characteristic for each of the substrates, the filling characteristic being associated with a size of the filling portion;
   determining an opening characteristic for each of the substrates based on the filling characteristics, the opening characteristic being associated with the depth and aspect ratio;
   processing each of the substrates; and providing fully processed integrated circuits using each of the substrates.

43. The method of claim 42 wherein the fully processed integrated circuits comprise capacitors.

44. The method of claim 42 wherein the fully processed integrated circuits comprise DRAMs.

* * * * *